US 6,444,541 B1

(12) United States Patent
Lai et al.

(10) Patent No.: US 6,444,541 B1
(45) Date of Patent: Sep. 3, 2002

(54) METHOD FOR FORMING LINING OXIDE IN SHALLOW TRENCH ISOLATION INCORPORATING PRE-ANNEALING STEP

(75) Inventors: Jun-Yang Lai, Ping-Tung; Jih-Hwa Wang, Hsin-chu; Chou-Jie Tsai, Hsin-chu; Chin-Te Huang, Chiayi; Su-Yu Yeh, Taipei; Meng-Shiun Shieh, Chinchu; Jang-Cheng Hsieh, Hsin-chu; Chung-Te Lin, Tainan, all of (TW)

(73) Assignee: Taiwan Semiconductor Manufacturing Co., Ltd, Hsin Chu (TW)

( * ) Notice: Subject to any disclaimer, the term of this patent is extended or adjusted under 35 U.S.C. 154(b) by 0 days.

(21) Appl. No.: 09/638,646

(22) Filed: Aug. 14, 2000

(51) Int. Cl.[7] ............................................. H01L 21/76
(52) U.S. Cl. ..................................................... 438/435
(58) Field of Search ................................. 438/424, 427, 438/435

(56) References Cited

U.S. PATENT DOCUMENTS 5,817,566 A * 10/1998 Jang et al. .................. 438/424

FOREIGN PATENT DOCUMENTS

JP        2000133702 A  *  5/2000   ........... H01L/21/76

OTHER PUBLICATIONS

Baker et al STI TEOS Densification for furnaces and RTP Tools IEEE 1999.*
Lee at al Etch–Induced damage in single crystal Si Trench Etching Elesiver Science 1999.*

* cited by examiner

Primary Examiner—Olik Chaudhuri
Assistant Examiner—David S Blum
(74) Attorney, Agent, or Firm—Tung & Associates

(57) ABSTRACT

A method for forming lining oxide in an opening for a shallow trench isolation and a method for forming a shallow trench isolation incorporating a lining oxide layer are described. In the method for forming lining oxide, a silicon substrate is first provided, followed by a process of forming a pad oxide layer and a silicon nitride mask sequentially on top of the silicon substrate. A trench opening is then patterned and formed in the silicon substrate for the shallow trench isolation. The silicon substrate is then annealed at a temperature of at least 1,000° C. in a furnace in an environment that contains not more than 10 vol. % oxygen. A lining oxide layer is formed in the same furnace used for annealing the structure of the trench opening in the silicon substrate.

17 Claims, 2 Drawing Sheets

METHOD FOR FORMING LINING OXIDE IN SHALLOW TRENCH ISOLATION INCORPORATING PRE-ANNEALING STEP

FIELD OF THE INVENTION

The present invention generally relates to a method for forming lining oxide in an opening for a shallow trench isolation (STI) and more particularly, relates to a method for forming lining oxide in an opening for a shallow trench isolation incorporating a pre-annealing step for repairing structural damages incurred in the silicon substrate by a dry etching process for forming the opening.

BACKGROUND OF THE INVENTION

In recently developed semiconductor fabrication technology, shallow trench isolations have been used in high density memory and other semiconductor devices since the isolation provides simplified back-end operations such as packaging. This is in contrast to a bird's beak type LOCOS isolation which provides an uneven top surface (or topography) on a memory device and leads to poor photo-lithographic results due to focusing difficulties. Shallow trench isolation can be etched in the silicon between neighboring devices. It allows a device to be built closer together.

When a shallow trench isolation is used in a semiconductor device, a more planar surface on the device can be obtained due to the absence of formation of bird's beak. Based on the advantages of a tighter line definition and a greater planarity that are achieved by the shallow trench isolation, the isolation is very suitable for applications in sub-half-micron semiconductor processes.

Isolation of individual semiconductor devices without using the bird's beak can be carried out by etching shallow vertical trenches in the silicon between neighboring devices. In shallow trench isolation, trenches of about 0.3 to 0.8 micron deep are anisotropically etched into a silicon substrate by a dry etching technique. The active regions in a substrate are protected from the etch during the trench etching step. After the trenches are formed, a chemical vapor deposition oxide is deposited on the wafer surface and then planarized so that only oxide remains in the trenches with its top surface at the same level as the original silicon surface. The processing technique has the advantages of not requiring any bird's beak and that no encroachment is involved. When two devices on a substrate are separated by a trench, the electrical field lines have to travel a longer distance and change directions twice, so that the field lines are considerably weakened. Shallow trenches of submicron dimensions are therefore adequate for isolation to prevent the punch-through and latch-up phenomena.

In a conventional shallow trench isolation forming process, for which a process flow chart 10 is shown in FIG. 1, a dry etching is carried out by utilizing high energy ion bombardment, for instance, in a reactive ion etching process. The high energy ion bombardment, while removing the unwanted silicon layer and thus forming the opening, also damages the remaining single crystal silicon material that surrounds the trench opening. For instance, the ion bombardment causes defects in single crystals such as dislocations that result in leakage current in the device fabricated and consequently, low yield of the fabrication process.

Two alternate conventional forming processes for a shallow trench isolation are shown in FIG. 1. In the first process, a silicon wafer is provided in step 12, followed by the formation of a pad oxide layer in step 14. A silicon nitride mask layer is then formed on top of the pad oxide layer in step 16, followed by a dry etching process shown in step 18 to form the trench opening. After the formation of the trench opening, a thin layer of silicon oxide is formed in the opening, as shown in step 20, in order to cover the corners of the opening and to facilitate the final deposition step 22 for the oxide isolation by a high density plasma chemical vapor deposition (HDP CVD) technique. In this first conventional method, no attempt is made to repair the damaged structure caused by ion bombardment in the dry etching step 18.

In an alternate method, also shown in FIG. 1, after step 20 during which a lining oxide layer is formed, a post-annealing process for the lining oxide layer in a nitrogen atmosphere is conducted in step 24. The trench opening is then filled with oxide by a HDP CVD process in step 26. The post-annealing process, i.e. step 24, is conducted at a temperature of about 1,100° C. in an attempt to repair the damaged crystal structure of the silicon substrate. Since the post-annealing process is conducted after the deposition of the lining oxide layer, the repair of the silicon structure under the lining oxide layer cannot be effectively carried out. Moreover, the post-annealing process requires a separate process recipe which further complicates the fabrication process.

It is therefore an object of the present invention to provide a method for forming lining oxide in an opening for a shallow trench isolation that does not have the drawbacks or shortcomings of the conventional forming methods.

It is another object of the present invention to provide a method for forming lining oxide in an opening for a shallow trench isolation that is capable of effectively repairing silicon structures damaged by a reactive ion etching process for forming the opening.

It is a further object of the present invention to provide a method for forming lining oxide in an opening for a shallow trench isolation by annealing the silicon structure after a dry etching process has been conducted for forming the opening prior to a lining oxide deposition process.

It is still another object of the present invention to provide a method for forming lining oxide in an opening for a shallow trench isolation by annealing a silicon substrate at 1,100° C. in an environment that contains oxygen for preventing the formation of silicon nitride.

It is yet another object of the present invention to provide a method for forming lining oxide in an opening for a shallow trench isolation by annealing the silicon substrate at a temperature of at least 1,000° C. in an environment that contains not more than 10 vol. % oxygen.

It is another further object of the present invention to provide a method for forming lining oxide in an opening for a shallow trench isolation by annealing a silicon substrate after a dry etching process prior to depositing the lining oxide layer in the trench opening.

It is still another further object of the present invention to provide a method for forming a shallow trench isolation incorporating a lining oxide layer by first dry etching a trench opening in the silicon substrate and then annealing the substrate to repair damages to the silicon structure prior to the deposition of the lining oxide layer.

It is yet another further object of the present invention to provide a method for forming a shallow trench isolation incorporating a lining oxide layer by first dry etching a trench opening and then annealing the silicon substrate at a temperature of at least 1,000° C. in an environment that contains less than 10 vol. % oxygen.

SUMMARY OF THE INVENTION

In accordance with the present invention, a method for forming lining oxide in an opening for a shallow trench isolation in a semiconductor structure and a method for forming a shallow trench isolation incorporating a lining oxide layer are provided.

In a preferred embodiment, a method for forming lining oxide in an opening for a shallow trench isolation in a semiconductor structure can be carried out by the operating steps of first providing a silicon substrate; forming a pad oxide layer on the silicon substrate; depositing a silicon nitride mask on the pad oxide layer; patterning and forming a trench opening in the silicon substrate for the shallow trench isolation; annealing the structure at a temperature of at least 1,000° C. in a furnace; and forming a lining oxide layer in the trench opening of the silicon substrate.

The method for forming lining oxide in an opening for a shallow trench isolation in a semiconductor structure may further include the step of annealing the structure in an environment that includes oxygen, or the step of annealing the structure in an environment that includes oxygen and nitrogen. The method may further include the step of annealing the structure in an environment that includes not more than 10 vol. % oxygen with the balance being an inert gas, or the step of annealing the structure in an environment that includes not more than 10 vol. % oxygen at a temperature of at least 1,100° C. The method may further include the step of filling the trench opening with silicon oxide after the lining oxide forming step. The method may further include the step of filling the trench opening with high density plasma chemical vapor deposition deposited silicon oxide on top of the lining oxide layer.

The method may further include the steps of filling the trench opening with HDP CVD oxide and planarizing the HDP CVD oxide forming a shallow trench isolation. The method may further include the step of planarizing the HDP CVD oxide by chemical mechanical polishing. The method may further include the step of forming the pad oxide layer to a thickness between about 100 Å and about 400 Å, or to a thickness preferably between about 200 Å and about 300 Å. The method may further include the step of forming the lining oxide layer to a thickness between about 100 Å and about 300 Å, or to a thickness preferably between about 150 Å and about 250 Å.

The present invention is further directed to a method for forming a shallow trench isolation incorporating a lining oxide layer which can be carried out by the operating steps of first providing a silicon substrate; forming a pad oxide layer on the substrate; forming a silicon nitride mask on the pad oxide layer; patterning a trench opening in the silicon nitride mask for the STI; dry etching the trench opening in the silicon substrate; annealing the silicon substrate at a temperature of at least 1,000° C. in an environment that contains oxygen; forming a lining oxide layer in the trench opening; and filling the trench opening with silicon oxide.

The method for forming a shallow trench isolation incorporating a lining oxide layer may further include the step of planarizing the STI after the trench opening filling step, or the step of annealing the silicon substrate and forming the lining oxide layer in the same furnace. The method may further include the step of filling the trench opening with HDP CVD oxide, or the step of annealing the silicon substrate at a temperature of at least 1,000° C. in an environment that includes oxygen and nitrogen, or the step of annealing the silicon substrate at a temperature of at least 1,000° C. in an environment that includes not more than 10 vol. % oxygen. The method may further include the step of annealing the silicon substrate at a temperature of at least 1,000° C. in an environment that includes a sufficient amount of oxygen so as to prevent the formation of silicon nitride.

BRIEF DESCRIPTION OF THE DRAWINGS

These and other objects, features and advantages of the present invention will become apparent from the following detailed description and the appended drawings in which.

DETAILED DESCRIPTION F THE PREFERRED EMBODIMENT

The present invention discloses a method for forming lining oxide in an opening for a shallow trench isolation in a semiconductor structure that allows repair of the silicon structure that is damaged by ion bombardment in a dry etching process for forming the opening. The method can be effectively carried out prior to the deposition of a lining oxide, instead of a post-annealing process conducted conventionally after the deposition of the lining oxide layer. It is a unique discovery of the present invention that by conducting the pre-annealing process in an environment that contains a small amount of oxygen, i.e. less than 10 vol. %, formation of any silicon nitride at the high annealing temperature (i.e. higher than 1,000° C.) can be avoided. As a result, the fabrication of poor quality silicon oxide film that fills the trench opening because of the presence of silicon nitride can be avoided.

The present invention novel method for forming lining oxide in an opening for a shallow trench isolation can be carried out by the operating steps of first providing a silicon substrate, forming a pad oxide layer on the silicon substrate, depositing a silicon nitride mask on the pad oxide layer, patterning and forming a trench opening in the silicon substrate for the shallow trench isolation, annealing the structure at a temperature of at least 1,000° C. in a furnace for at least 1 hour, and forming a lining oxide layer in the trench opening of the silicon substrate. It is preferred that the annealing step, or the annealing step prior to the lining oxide formation process, should be carried out in an environment that contains a small amount of oxygen, such as less than 10 vol. %. The balance of the environment can be made up of an inert gas, i.e. as nitrogen or any other suitable inert gas. The annealing, or pre-annealing process, should be carried out at a temperature of at least 1,000° C., or preferably at a temperature of at least 1,100° C. The pad oxide layer should be deposited to a thickness between about 200 Å and about 300 Å, or to a thickness of about 250 Å. The thickness of the lining oxide deposited should be in the range between about 150 Å and about 250 Å, or to a thickness of about 200 Å.

The present invention further discloses a method for forming a shallow trench isolation. The method can be carried out by first providing a silicon substrate, forming a pad oxide layer on the silicon substrate to a thickness of about 250 Å, forming a silicon nitride mask on the pad oxide layer, patterning a trench opening in the silicon nitride mask, dry etching by ion bombardment the trench opening in the silicon substrate, annealing the silicon substrate at a temperature of at least 1,000° C. in an environment that contains less than 10 vol. % oxygen, forming a lining oxide layer in the trench opening to a thickness of about 200 Å, and filling the trench opening with silicon oxide by HDP CVD.

Figure 1:
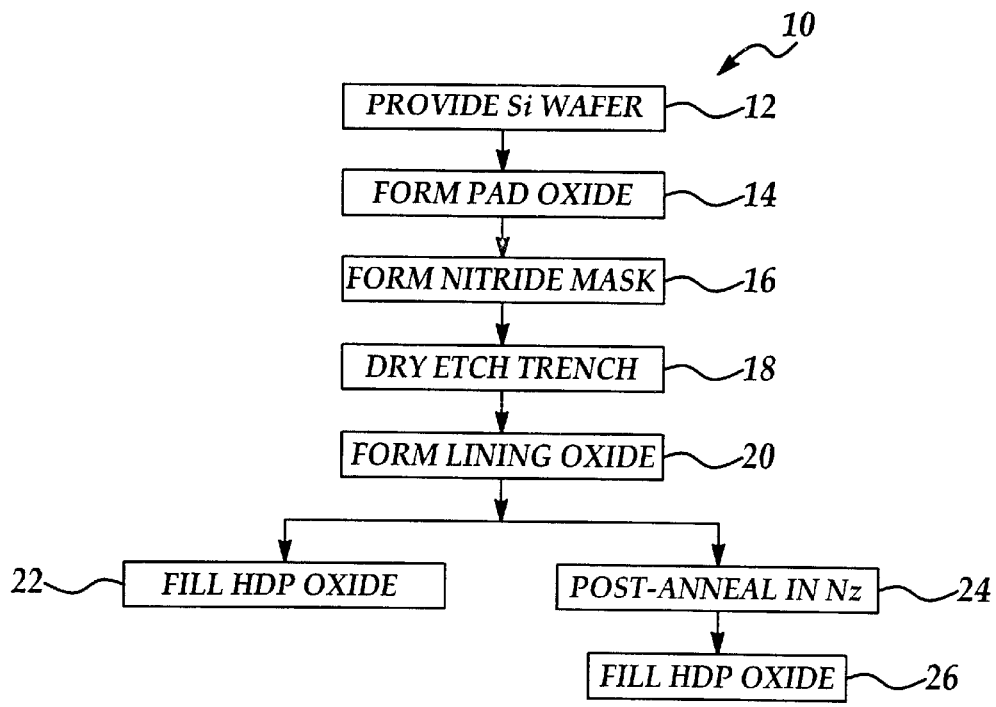
FIG. 1 is a process flow diagram illustrating two conventional methods of forming shallow trench isolation with a lining oxide layer.
Figure 2:
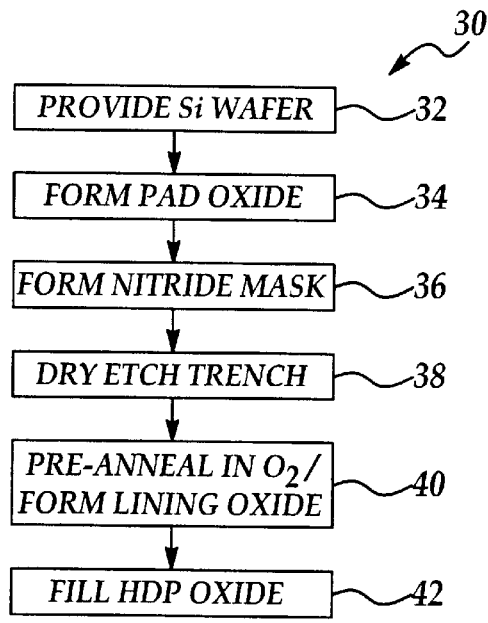
FIG. 2 is a process flow diagram illustrating the present invention method for forming shallow trench isolation incorporating a lining oxide layer and a pre-annealing step for the silicon substrate e after the dry etching step.
Figure 3A:
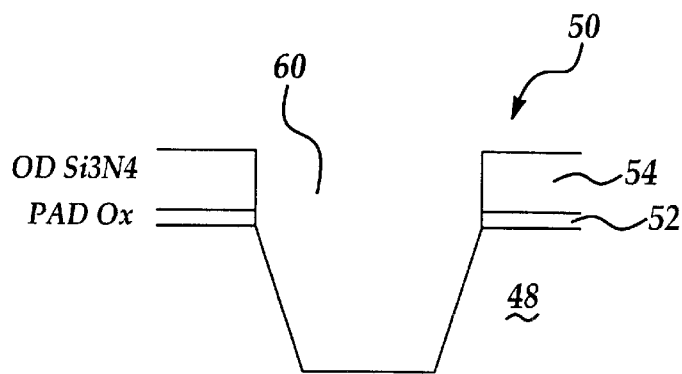
FIG. 3A is an enlarged, cross-sectional view of a trench opening formed for the present invention shallow trench isolation.

Referring now to FIG. 2, wherein a process flow diagram 30 for the present invention novel method for forming lining oxide in an opening for a shallow trench isolation is shown. In the process flow diagram 30, a silicon wafer is first provided in step 32, followed by the formation of a pad oxide layer of a thickness between about 100 Å and about 400 Å, as shown in step 34. The pad oxide layer 52 is further shown in FIG. 3A, corresponding to step 34. The shallow trench isolation 50 in a semiconductor structure is shown in FIG. 3A. In the next step of the process, as shown in step 36, a silicon nitride layer 54, shown in FIG. 3A is deposited for use as a photomask layer for patterning of the shallow trench isolation opening.

An opening 60 for the shallow trench isolation 50 is then formed by a dry etching method, as shown in step 38 of FIG. 2, utilizing ion bombardment for etching away the pad oxide layer 52 and the single crystal silicon 48. This is also shown in FIG. 3A.

Figure 3B:
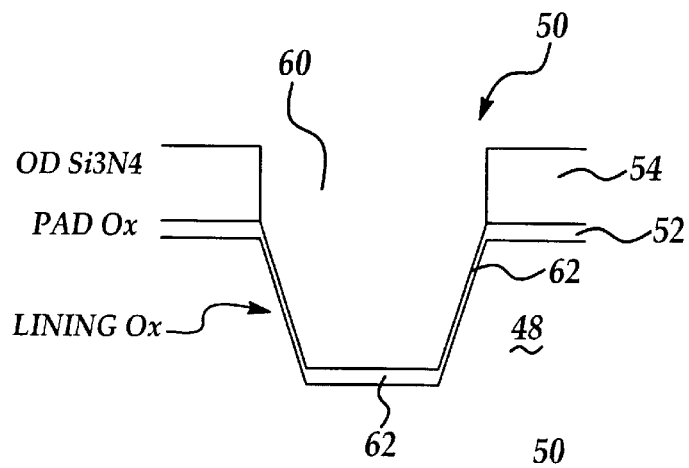
FIG. 3B is an enlarged, cross-sectional view of the opening for the present invention shallow trench isolation of FIG. 3A with a lining oxide layer formed therein.

During the dry etching process for forming the trench opening 60, the high energy ion bombardment not only removes the pad oxide layer 52 and the silicon layer 48, but also creates various damages in the crystalline silicon structure of the silicon material 48. In order to repair such damages and to restore the integrity of the silicon substrate, the present invention novel method anneals the silicon substrate immediately after the dry etching step 38 and before the lining oxide layer formation step, as shown in FIG. 3B. The in-situ pre-annealing process can be carried out in the same furnace tube as used in the next process step for growing the lining oxide layer 62.

It is another unique discovery of the present invention that, by conducting the pre-annealing process in an environment that contains a small amount of oxygen, the potential formation of any silicon nitride at a high annealing temperature of 1,100° C. between silicon and nitrogen can be avoided. Such formation causes a poor quality silicon oxide layer to be formed subsequently in the oxide formation process. By a small amount, it is meant that a vol. % of less than 10% of oxygen is used in the environment, with the balance being an inert gas. A suitable inert gas may be nitrogen, however, any other suitable inert gas may also be utilized. The pre-annealing step in oxygen and nitrogen is shown as step 40 in FIG. 2.

In the same process recipe for pre-annealing the trench opening 60, and conducted in the same furnace tube, is the step for forming the lining oxide layer 62, shown in FIG. 3B. It is discovered that a suitable pre-annealing time for the trench opening 60 may be 1 hour, while the lining oxide layer of about 200 Å, or in the range between about 100 Å and about 300 Å, and preferably between about 150 Å and about 250 Å can be formed in a time period between about 0.5 hour and about 2 hours.

In a typical pre-annealing process, the silicon substrate may be heated by ramping up the furnace temperature to about 1,100° C. at an oxygen flow rate of about 0.5 liter/min, and a nitrogen flow rate of about 10 liter/min into the furnace tube. After a suitable annealing period, i.e. between about 0.5 hour and about 1.5 hours, or an average of 1 hour has passed, the temperature of the furnace is ramped down to about 920° C. with a flow of nitrogen only at about 10 liter/min. With the furnace temperature kept at 120° C., the lining oxide layer formation process can be started by flowing into the furnace tube oxygen at a flow rate of about 10 liter/min for a suitable time period such as 2 hours. A chlorine-containing chemical such as $C_2H_2Cl_2$ can also be used at a low concentration, i.e. less than 2 vol. %, to improve the quality of the lining oxide layer formed.

Figure 3C:
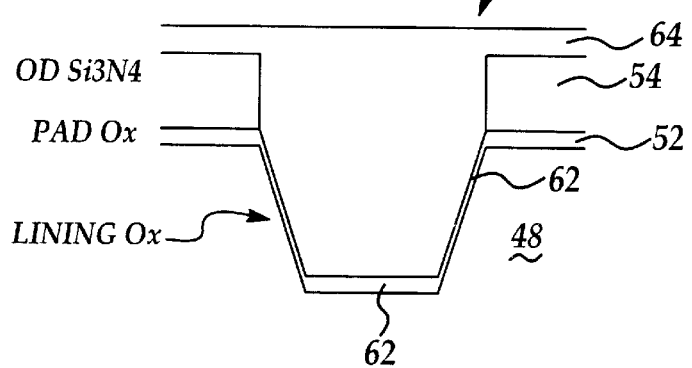
FIG. 3C is an enlarged, cross-sectional view of the trench opening for the present invention shallow trench isolation of FIG. 3B after a silicon oxide layer is deposited filling the trench opening.

In the next step of the process, shown as step 42 in FIG. 2 and in FIG. 3C, silicon oxide 64 is filled into the trench opening 60 by a technique such as high density plasma chemical vapor deposition. The lining oxide layer 62 deposited prior to the silicon oxide filling process helps to eliminate corner effect (i.e. where corners are difficult to cover) of the silicon oxide deposition process.

Figure 3D:
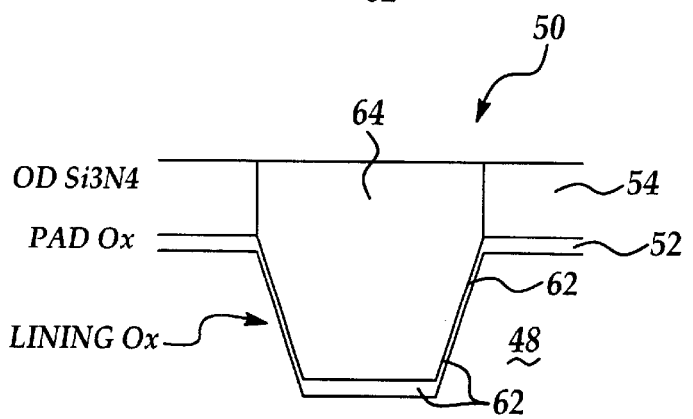
FIG. 3D is an enlarged, cross-section view of the present invention shallow trench isolation of FIG. 3C after the top surface of the STI is planarized.

In the final step of the process, as shown in FIG. 3D, a planarization technique, such as chemical mechanical polishing, is used to planarize the top surface of the shallow trench isolation 50 such that it is leveled with the top surface of the nitride layer 54.

By utilizing the present invention novel method, it was discovered that damages to the crystalline silicon structure can be effectively repaired thus resulting in a yield improvement of about 15% in a fabrication process for 0.18 $\mu$m logic devices. The in-line throughput of the fabrication process can also be improved by about 50% by combining the conventional two-step process (depositing lining oxide and post-annealing lining oxide) into a single recipe of the present invention method. The present invention also produces oxide-films of improved quality without the problem caused by silicon nitride formed at high temperature between nitrogen carrier gas and the silicon substrate.

The present invention novel method for forming lining oxide in an opening for a shallow trench isolation and a method for forming a shallow trench isolation incorporating a lining oxide layer have therefore been amply described in the above description and in the appended drawings of FIGS. 2–3D.

While the present invention has been described in an illustrative manner, it should be understood that the terminology used is intended to be in a nature of words of description rather than of limitation.

Furthermore, while the present invention has been described in terms of a preferred embodiment, it is to be appreciated that those skilled in the art will readily apply these teachings to other possible variations of the inventions.

The embodiment of the invention in which an exclusive property or privilege is claimed are defined as follows:

What is claimed is:

1. A method for forming lining oxide in an opening for a shallow trench isolation (STI) in a semiconductor structure comprising the sequential steps of:
   providing a silicon substrate;
   forming a pad oxide layer on said substrate;
   depositing a silicon nitride mask on said pad oxide layer;
   patterning and forming a trench opening in said silicon substrate for said STI;
   annealing the structure at a temperature of at least 1,000° C. in a furnace in an environment containing $O_2$;
   forming a lining oxide layer in said trench opening of the silicon substrate;

filling said trench opening with HDP CVD oxide; and planarizing said HDP CVD oxide by chemical mechanical polishing forming said STI.

2. A method for forming lining oxide in an opening for a shallow trench isolation in a semiconductor structure according to claim 1 further comprising the step of annealing said structure in an environment that comprises $O_2$ and $N_2$.

3. A method for forming lining oxide in an opening for a shallow trench isolation in a semiconductor structure according to claim 1 further comprising the step of annealing said structure in an environment that comprises not more than 10 vol. % $O_2$ with the balance being an inert gas.

4. A method for forming lining oxide in an opening for a shallow trench isolation in a semiconductor structure according to claim 1 further comprising the step of annealing said structure in an environment that comprises not more than 10 vol. % $O_2$ at a temperature of at least 1,100° C.

5. A method for forming lining oxide in an opening for a shallow trench isolation in a semiconductor structure according to claim 1 further comprising the step of filling said trench opening with silicon oxide after said lining oxide forming step.

6. A method for forming lining oxide in an opening for a shallow trench isolation in a semiconductor structure according to claim 1 further comprising the step of filling said trench opening with high density plasma chemical vapor deposition (HDP CVD) deposited silicon oxide on top of said lining oxide layer.

7. A method for forming lining oxide in an opening for a shallow trench isolation in a semiconductor structure according to claim 1 further comprising the step of forming said pad oxide layer to a thickness between about 100 Å and about 400 Å.

8. A method for forming lining oxide in an opening for a shallow trench isolation in a semiconductor structure according to claim 1 further comprising the step of forming said pad oxide layer to a thickness preferably between about 200 Å and about 300 Å.

9. A method for forming lining oxide in an opening for a shallow trench isolation in a semiconductor structure according to claim 1 further comprising the step of forming said lining oxide layer to a thickness between about 100 Å and about 300 Å.

10. A method for forming lining oxide in an opening for a shallow trench isolation in a semiconductor structure according to claim 1 further comprising the step of forming said lining oxide layer to a thickness preferably between about 150 Å and about 250 Å.

11. A method for forming a shallow trench isolation (STI) incorporating a lining oxide layer comprising the sequential steps of:

providing a silicon substrate;

forming a pad oxide layer on said substrate;

forming a silicon nitride mask on said pad oxide layer;

patterning a trench opening in said silicon nitride mask for said STI;

dry etching said trench opening in said silicon substrate;

annealing said silicon substrate at a temperature of at lest 1,000° C. in an environment that contains $O_2$;

forming a lining oxide layer in said trench opening; and filling said trench opening with silicon oxide.

12. A method for forming a shallow trench isolation (STI) incorporating a lining oxide layer according to claim 11 further comprising the step of planarizing said STI after said trench opening filling step.

13. A method for forming a shallow trench isolation (STI) incorporating a lining oxide layer according to claim 11 further comprising the step of annealing said silicon substrate and forming said lining oxide layer in the same furnace.

14. A method for forming a shallow trench isolation (STI) incorporating a lining oxide layer according to claim 11 further comprising the step of filling said trench opening with HDP CVD oxide.

15. A method for forming a shallow trench isolation (STI) incorporating a lining oxide layer according to claim 11 further comprising the step of annealing said silicon substrate at a temperature of at least 1,000° C. in an environment comprising $O_2$ and $N_2$.

16. A method for forming a shallow trench isolation (STI) incorporating a lining oxide layer according to claim 11 further comprising the step of annealing said silicon substrate at a temperature of at least 1,000° C. in an environment comprising not more than 10 vol. % $O_2$.

17. A method for forming a shallow trench isolation (STI) incorporating a lining oxide layer according to claim 11 further comprising the step of annealing said silicon substrate at a temperature of at least 1,000° C. in an environment comprising a sufficient amount of $O_2$ such as to prevent the formation of silicon nitride.

* * * * *